(12) United States Patent
Huang

(10) Patent No.: US 12,401,333 B2
(45) Date of Patent: Aug. 26, 2025

(54) AMPLIFIER

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 469 days.

(21) Appl. No.: 17/821,525

(22) Filed: Aug. 23, 2022

(65) Prior Publication Data

US 2023/0327619 A1 Oct. 12, 2023

(30) Foreign Application Priority Data

Apr. 11, 2022 (TW) .................................. 111113630

(51) Int. Cl.
*H03F 3/45* (2006.01)
*H03F 1/08* (2006.01)

(52) U.S. Cl.
CPC .......... *H03F 3/45076* (2013.01); *H03F 1/083* (2013.01); *H03F 2203/45526* (2013.01)

(58) Field of Classification Search
CPC ................. H03F 3/45076; H03F 1/083; H03F 2203/45526; H03F 2200/129; H03F 2200/141; H03F 2200/144; H03F 2200/75; H03F 2203/45528; H03F 3/45179; H03F 3/265

USPC ......................................................... 330/253
See application file for complete search history.

(56) References Cited

U.S. PATENT DOCUMENTS

2009/0267691 A1* 10/2009 Chen ................... H03F 3/45237
330/252
2015/0077183 A1 3/2015 Ciubotaru

* cited by examiner

*Primary Examiner* — Andrea Lindgren Baltzell
*Assistant Examiner* — Khiem D Nguyen
(74) *Attorney, Agent, or Firm* — WPAT, P.C.; Anthony King

(57) ABSTRACT

The present application discloses an amplifier, including: a positive-end PMOS; a negative-end PMOS; a positive-end NMOS, having a drain coupled to a drain of the positive-end PMOS and outputting a negative-end output signal; a negative-end NMOS, having a drain coupled to a drain of the negative-end PMOS and outputting a positive-end output signal; a first resistor, coupled between a gate of the negative-end NMOS and a negative-end input signal; a second resistor, coupled between a gate of the negative-end NMOS and the positive-end output signal; a third resistor, coupled between a gate of the negative-end PMOS and the negative-end input signal; and a fourth resistor, coupled between a gate of the negative-end PMOS and the positive-end output signal.

20 Claims, 9 Drawing Sheets

AMPLIFIER

CROSS-REFERENCE TO RELATED APPLICATIONS

This application claims priority of Taiwan application No. 111113630 filed on Apr. 11, 2022, which is incorporated by reference in its entirety.

TECHNICAL FIELD

The present application relates to a circuit, particularly to an amplifier circuit.

BACKGROUND

For differential amplifiers composed of cascoded transistors, the input common-mode voltages of the cascoded P-type transistors and N-type transistors may not be designed to have identical values, which means that different DC bias voltages are required to ensure proper operation. The common practice is to use an AC coupling capacitor coupled between the gate of the cascoded P-type transistor and the gate of the N-type transistor, but this is not efficient and consumes a large area.

SUMMARY OF THE INVENTION

The present application provides an amplifier, including: an amplifying unit, including: a positive-end P-type transistor; a negative-end P-type transistor; a positive-end N-type transistor, wherein the positive-end P-type transistor and the positive-end N-type transistor are cascoded between a first reference voltage and a second reference voltage, and a drain of the positive-end N-type transistor is coupled to a drain of the positive-end P-type transistor and outputs a negative-end output signal; and a negative-end N-type transistor, wherein the negative-end P-type transistor and the negative-end N-type transistor are cascoded between the first reference voltage and the second reference voltage, a drain of the negative-end N-type transistor is coupled to a drain of the negative-end P-type transistor and outputs a positive-end output signal; a first resistor, coupled between a gate of the negative-end N-type transistor and a negative-end input signal; a second resistor, coupled between a gate of the negative-end N-type transistor and the positive-end output signal; a third resistor, coupled between a gate of the negative-end P-type transistor and the negative-end input signal; and a fourth resistor, coupled between a gate of the negative-end P-type transistor and the positive-end output signal.

The present application provides an amplifier, including: an amplifying unit, including: a positive-end P-type transistor; a negative-end P-type transistor; a positive-end N-type transistor, wherein the positive-end P-type transistor and the positive-end N-type transistor are cascoded between a first reference voltage and a second reference voltage, and a drain of the positive-end N-type transistor is coupled to a drain of the positive-end P-type transistor and outputs a negative-end output signal; and a negative-end N-type transistor, wherein the negative-end P-type transistor and the negative-end N-type transistor are cascoded between the first reference voltage and the second reference voltage, and a drain of the negative-end N-type transistor is coupled to a drain of the negative-end P-type transistor and outputs a positive-end output signal; a first resistor, coupled between a gate of the negative-end N-type transistor and a negative-end input signal; a second resistor, coupled between a gate of the negative-end P-type transistor and the negative-end input signal; a first capacitor, coupled between a gate of the negative-end N-type transistor and the positive-end output signal; a second capacitor, coupled between a gate of the negative-end P-type transistor and the positive-end output signal; and a first current source, coupled to a gate of the negative-end N-type transistor or a gate of the negative-end P-type transistor, to control the DC voltage of a gate of the negative-end N-type transistor or the DC voltage of a gate of the negative-end P-type transistor.

The present application provides an amplifier, including: an amplifying unit, including: a positive-end P-type transistor; a negative-end P-type transistor; a positive-end N-type transistor, wherein the positive-end P-type transistor and the positive-end N-type transistor are cascoded between a first reference voltage and a second reference voltage, and a drain of the positive-end N-type transistor is coupled to a drain of the positive-end P-type transistor and outputs a negative-end output signal; and a negative-end N-type transistor, wherein the negative-end P-type transistor and the negative-end N-type transistor are cascoded between the first reference voltage and the second reference voltage, and a drain of the negative-end N-type transistor is coupled to a drain of the negative-end P-type transistor and outputs a positive-end output signal; a first capacitor, coupled between a gate of the negative-end N-type transistor and a negative-end input signal; a second capacitor, coupled between a gate of the negative-end P-type transistor and the negative-end input signal; a first resistor, coupled between a gate of the negative-end N-type transistor and the positive-end output signal; a second resistor, coupled between a gate of the negative-end P-type transistor and the positive-end output signal; and a first current source, coupled to a gate of the negative-end N-type transistor or a gate of the negative-end P-type transistor, to control the DC voltage of a gate of the negative-end N-type transistor or the DC voltage of a gate of the negative-end P-type transistor.

With the present disclosure, the efficiency of the amplifier can be improved and the area can be reduced.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
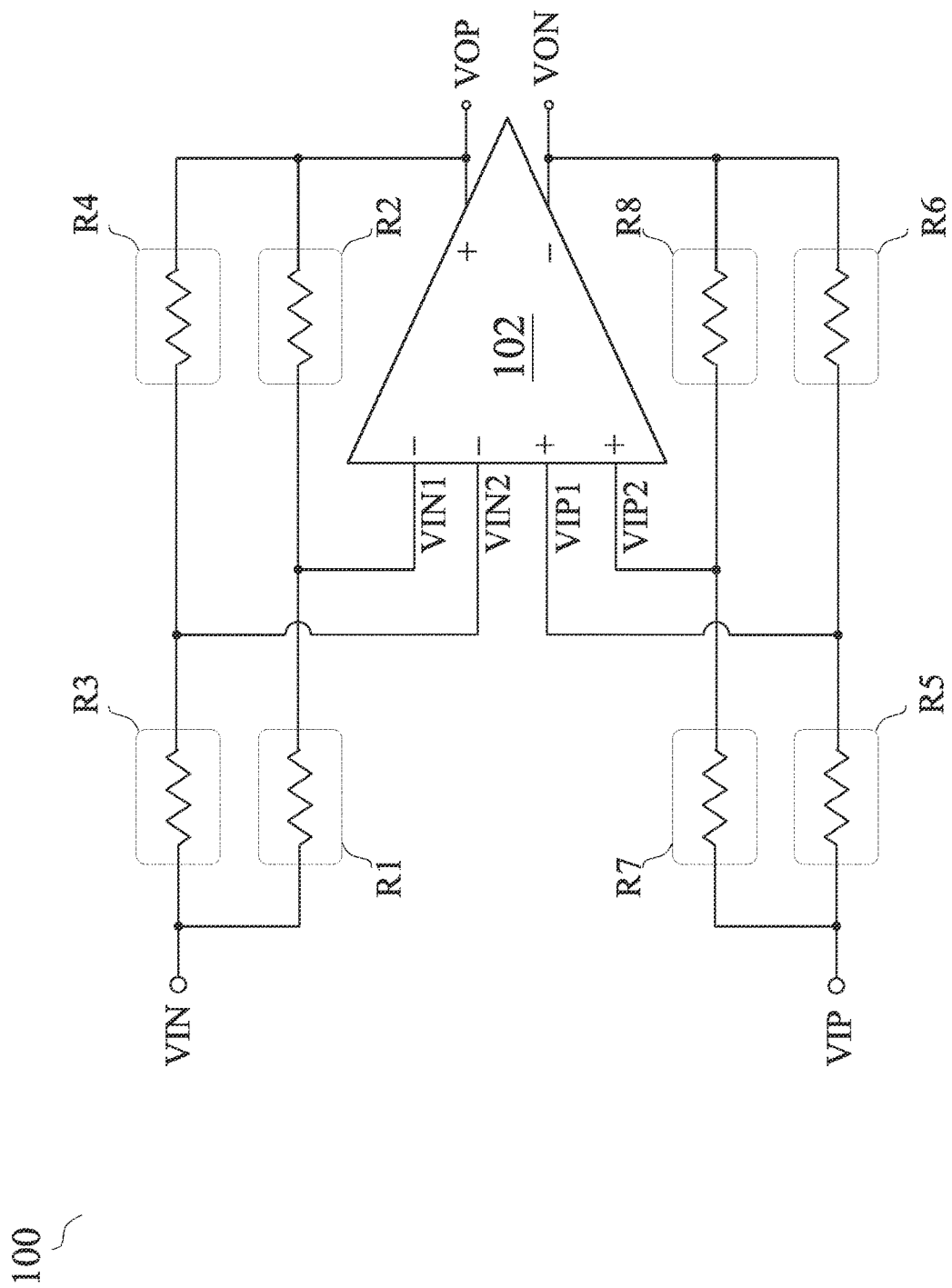
FIG. 1 is a schematic diagram illustrating an amplifier according to a first embodiment of the present disclosure.

FIG. 1 is a schematic diagram illustrating an amplifier according to a first embodiment of the present disclosure. The amplifier 100 is a differential input/output amplifier, wherein the amplifier's differential input signal pair includes a positive-end input signal VIP and a negative-end input signal VIN; and the amplifier's differential output signal pair includes a positive-end output signal VOP and a negative-end output signal VON. The amplifier 100 includes an amplifying unit 102, resistors R1-R8. The amplifying unit 102 receives a first positive-end signal VIP1, a second positive-end signal VIP2, a first negative-end signal VIN1 and a second negative-end signal VIN2, and outputs the positive-end output signal VOP and the negative-end output signal VON.

Figure 2:
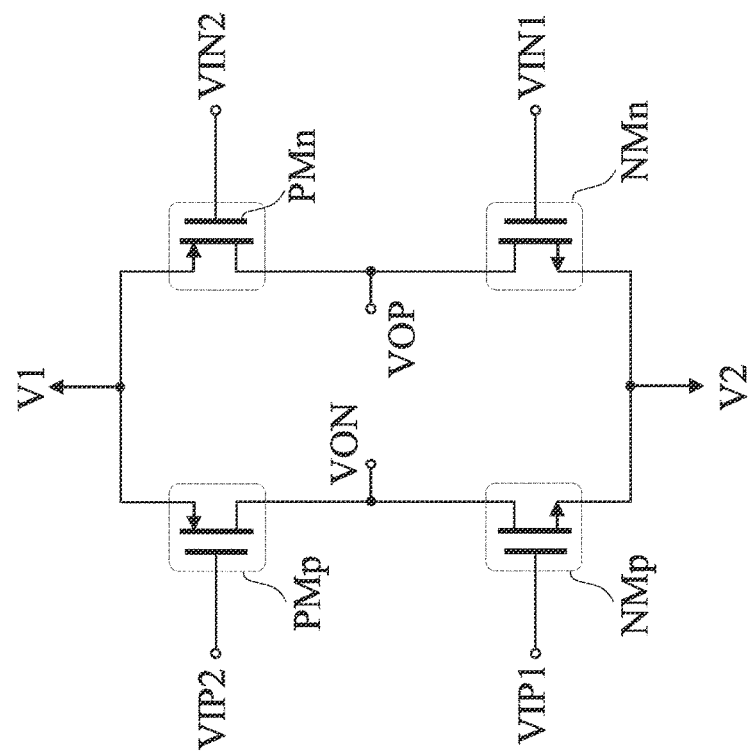
FIG. 2 is a schematic diagram illustrating an amplifying unit of the amplifier according to one embodiment of the present disclosure.
Figure 3:
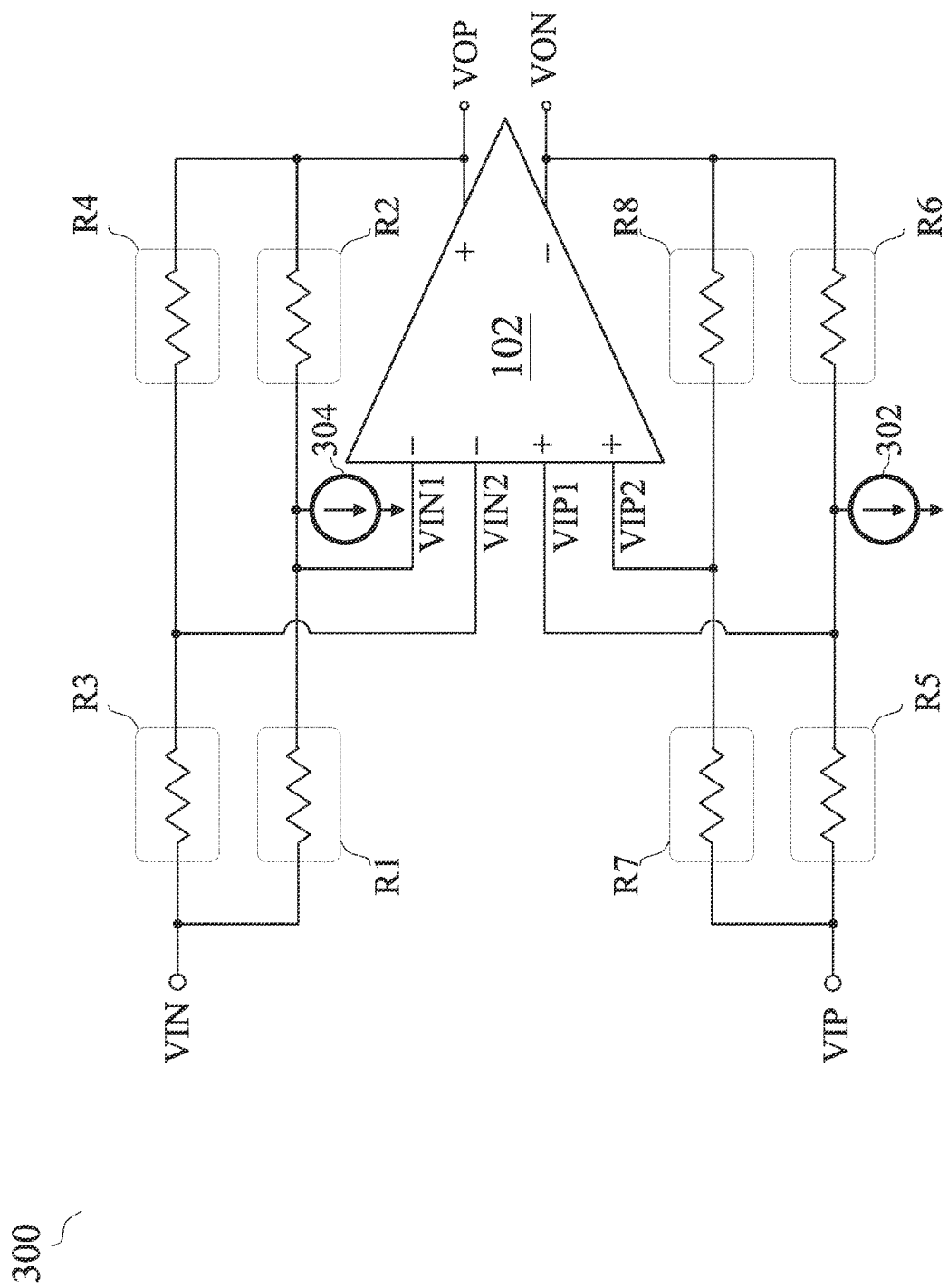
FIG. 3 is a schematic diagram illustrating an amplifier according to a second embodiment of the present disclosure.

FIG. 2 is a schematic diagram illustrating the amplifying unit 102 of the amplifier according to one embodiment of the present disclosure, wherein the amplifying unit 102 is applicable to be used as the amplifying unit 102 in the amplifier 100/300/400/500/600/700/800/900 illustrated in FIG. 1 and FIGS. 3-9. In this embodiment, the amplifying unit 102 includes a positive-end P-type transistor PMp, a negative-end P-type transistor PMn, a positive-end N-type transistor NMp and a negative-end N-type transistor NMn. In this case, the positive-end P-type transistor PMp and the positive-end N-type transistor NMp are cascoded between a reference voltage V1 and a reference voltage V2; the negative-end P-type transistor PMn and the negative-end N-type transistor NMn are cascoded between the reference voltage V1 and the reference voltage V2. Specifically, the drain of the positive-end P-type transistor PMp is coupled to the drain of the positive-end N-type transistor NMp; and the drain of the negative-end P-type transistor PMn is coupled to the drain of the negative-end N-type transistor NMn. The gate of the positive-end N-type transistor NMp receives the first positive-end signal VIP1, the gate of the positive-end P-type transistor PMp receives the second positive-end signal VIP2, the gate of the negative-end N-type transistor NMn receives the first negative-end signal VIN1, and the gate of the negative-end P-type transistor PMn receives the second negative-end signal VIN2. In the present embodiment, the reference voltage V1 is higher than the reference voltage V2, and the reference voltage V2 is the ground voltage. In certain embodiments, a current source can be disposed near the reference voltage V1 and/or voltage V2.

Reference is made to both FIG. 1 and FIG. 2, wherein the resistor R1 is coupled between the gate of the negative-end N-type transistor NMn and the negative-end input signal VIN; the resistor R2 is coupled between the gate of the negative-end N-type transistor NMn and the positive-end output signal VOP; the resistor R3 is coupled between the gate of the negative-end P-type transistor PMn and the negative-end input signal VIN; the resistor R4 is coupled between the gate of the negative-end P-type transistor PMn and the positive-end output signal VOP; the resistor R5 is coupled between the gate of the positive-end N-type transistor NMp and the positive-end input signal VIP; the resistor R6 is coupled between the gate of the positive-end N-type transistor NMp and the negative-end output signal VON; the resistor R7 is coupled between the gate of the positive-end P-type transistor PMp and the positive-end input signal VIP; the resistor R8 is coupled between the gate of the positive-end P-type transistor PMp and the negative-end output signal VON.

When determining the voltage values of the resistors R1-R8, the proportional relationships among the resistances of resistors R1-R4 are first found based on the desired AC gain of amplifier 100 and the DC voltage of the first negative-end signal VIN1 and the second negative-end signal VIN2. Similarly, the proportional relationships among the resistances of resistors R5-R8 can be found based on the desired AC gain of amplifier 100 and the DC voltages of the first positive-end signal VIP1 and the second positive-end signal VIP2. Therefore, when the DC voltage of first negative-end signal VIN1 differs from the DC voltage of the second negative-end signal VIN2, the ratio of the resistance of the resistor R1 to the resistance of the resistor R2 differs from the ratio of the resistance of the resistor R3 to the resistance of the resistor R4; the ratio of the resistance of the resistor R5 to the resistance of the resistor R6 differs from the ratio of the resistance of the resistor R7 to the resistance of the resistor R8. However, the ratio of the resistance of the resistor R1 to the resistance of resistor R2 equals to the ratio of the resistance of the resistor R5 to the resistance of the resistor R6; and the ratio of the resistance of the resistor R3 to the resistance of the resistor R4 equals to the ratio of the resistance of the resistor R7 to the resistance of the resistor R8.

In certain embodiments, the resistors R1-R8 can be implemented using resistors in the form of switching capacitors. In certain embodiments, the amplifier 300 of FIG. 3 can also be provided with additional current source 302 and current source 304 at the gate of the positive-end N-type transistor NMp and the gate of the negative-end N-type transistor NMn, respectively, to adjust the DC voltages of the first positive-end signal VIP1 and the first negative-end signal VIN1. In this way, the resistors R1-R8 only affect the AC gain of the amplifier 300, thus increasing the flexibility and convenience of the design. For example, the ratio of the resistance of resistor R1 to the resistance of resistor R2 can be controlled to be the same as the ratio of the resistance of resistor R3 to the resistance of resistor R4, the ratio of the resistance of resistor R5 to the resistance of resistor R6, and the ratio of the resistance of resistor R7 to the resistance of resistor R8.

It is noted that the current source 304 and the current source 302 can also be set at the gate of the positive-end P-type transistor PMp and the gate of the negative-end P-type transistor PMn, or current sources can be set at all of the gate of the positive-end N-type transistor NMp, the gate of the negative-end N-type transistor NMn, the gate of the positive-end P-type transistor PMp and the gate of the negative-end P-type transistor PMn.

Figure 4:
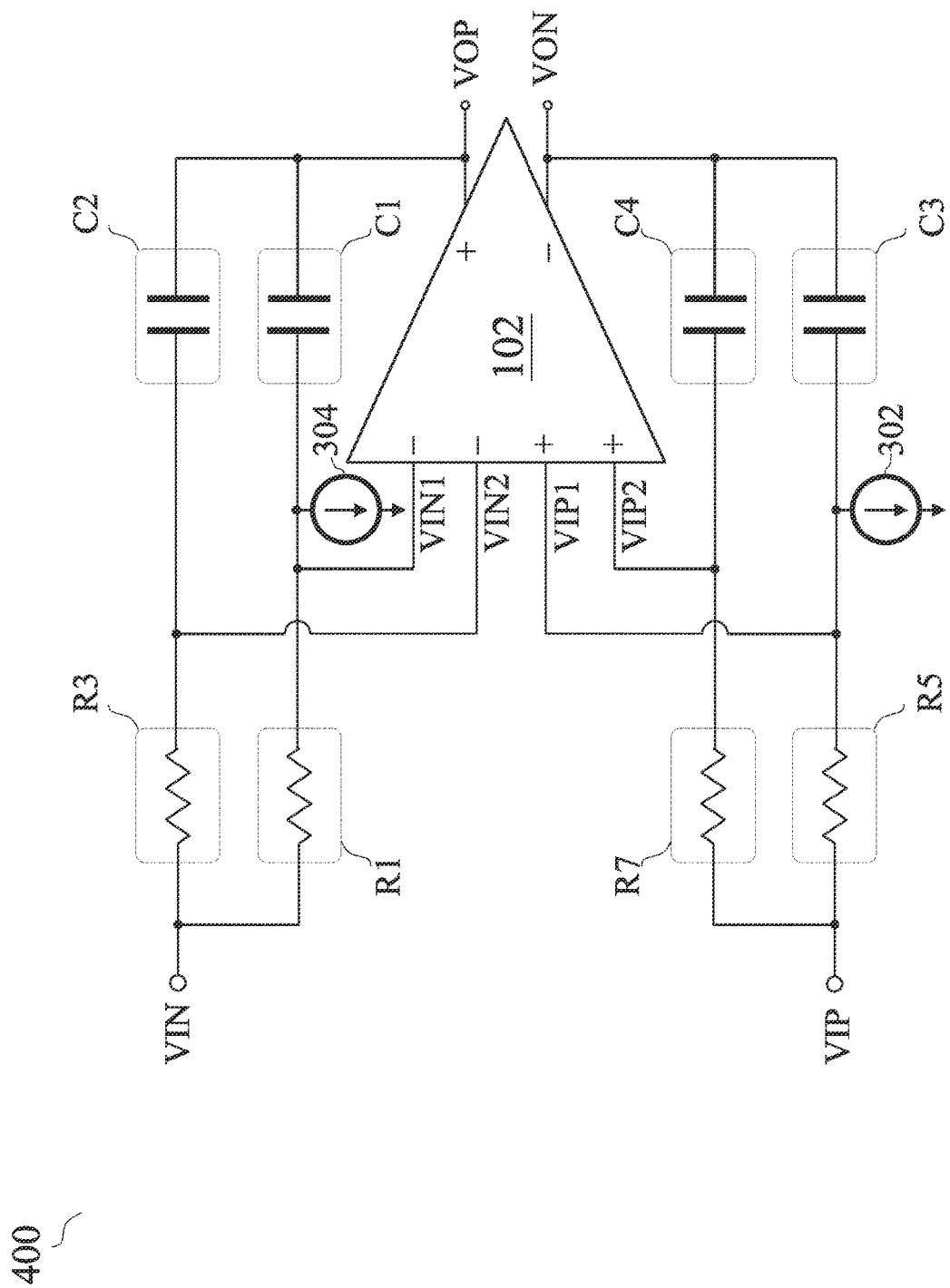
FIG. 4 is a schematic diagram illustrating an amplifier according to a third embodiment of the present disclosure.

In certain embodiments, it is feasible to replace the resistor R2, the resistor R4, the resistor R6 and the resistor R8 of the amplifier 300 as capacitors C1-C4, as shown in the amplifier 400 of FIG. 4. Since the capacitors C1-C4 are open to the DC, it is better to use a current source to control DC voltage. In other words, the amplifier 400 of FIG. 4 requires a current source 302 and a current source 304 at the gate of the positive-end N-type transistor NMp and the gate of the negative-end N-type transistor NMn, respectively. It is noted that the source 302 and the current source 304 can be instead set at the gate of the positive-end P-type transistor PMp and the gate of the negative-end P-type transistor PMn, or current sources can be set at all of the gate of the positive-end N-type transistor NMp, the gate of the negative-end N-type transistor NMn, the gate of the positive-end P-type transistor PMp and the gate of the negative-end P-type transistor PMn.

Figure 5:
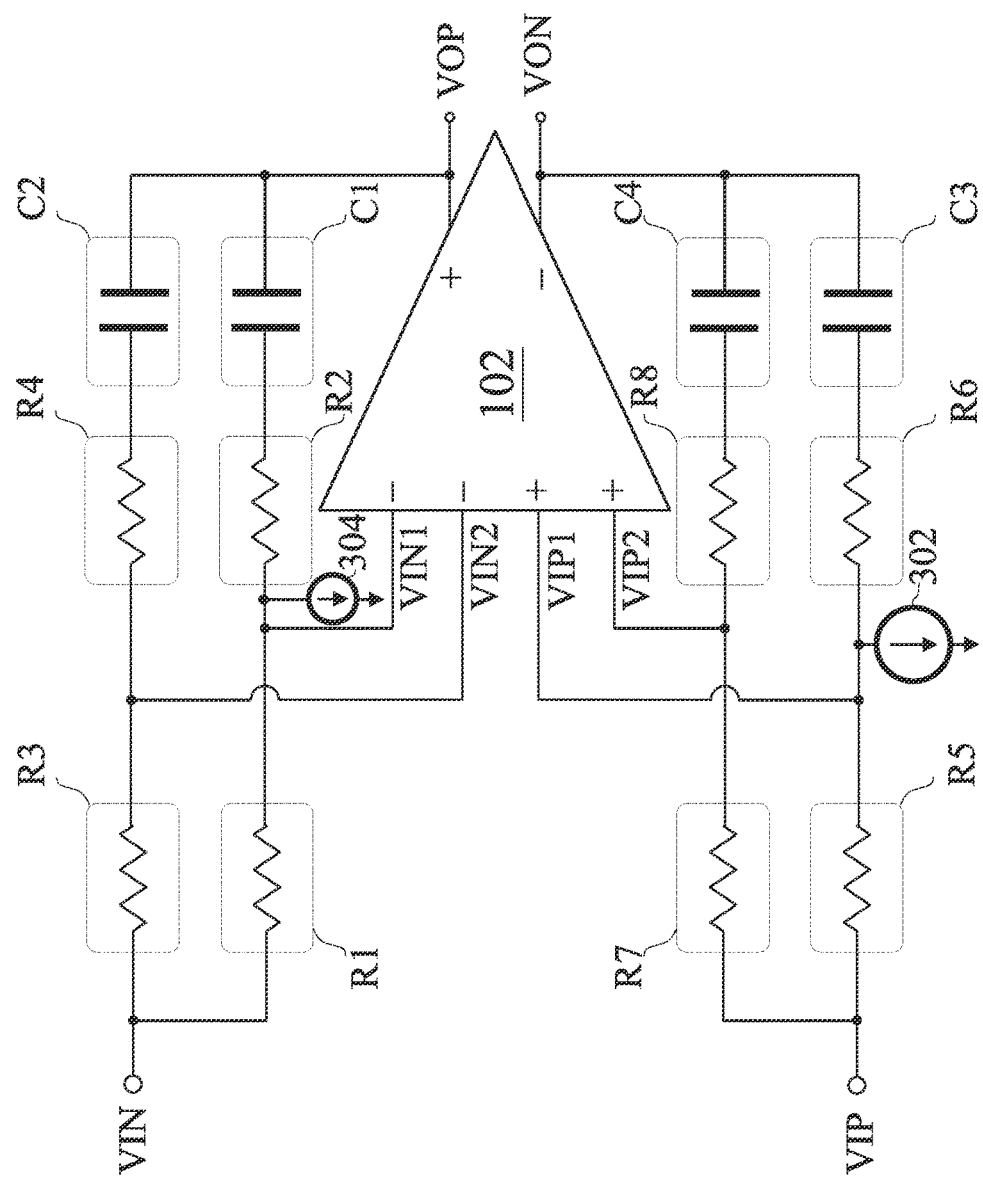
FIG. 5 is a schematic diagram illustrating an amplifier according to a fourth embodiment of the present disclosure.
Figure 6:
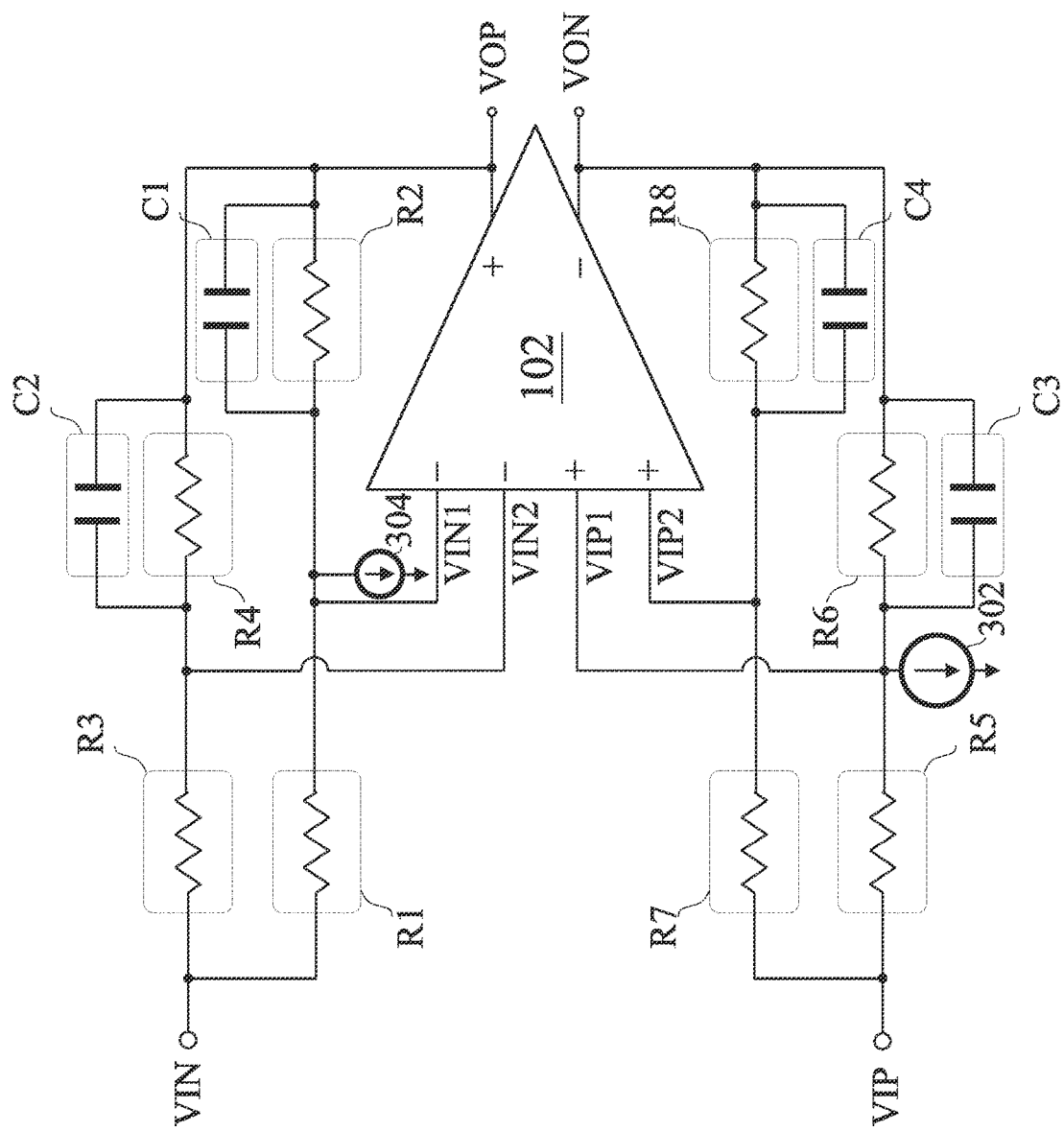
FIG. 6 is a schematic diagram illustrating an amplifier according to a fifth embodiment of the present disclosure.

In certain embodiments, it is feasible to combine the amplifier 300 and the amplifier 400, and have the resistor R2, the resistor R4, the resistor R6 and the resistor R8 set in series with the capacitors C1-C4, correspondingly, as shown in the amplifier 500 of FIG. 5. In certain embodiments, the resistor R2, the resistor R4, the resistor R6 and the resistor R8 can be set at parallel with the capacitors C1-C4, as shown in the amplifier 600 of FIG. 6.

Figure 7:
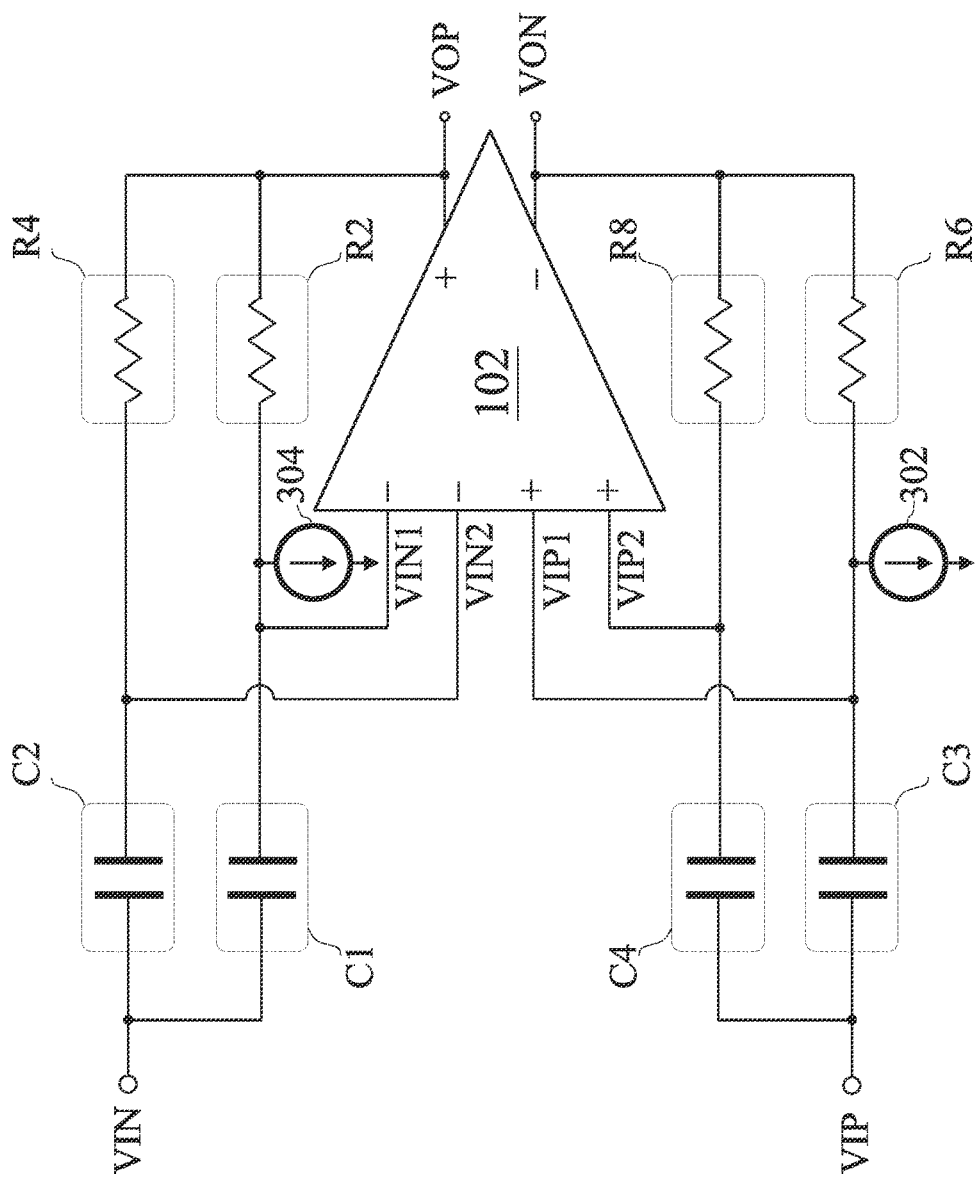
FIG. 7 is a schematic diagram illustrating an amplifier according to a sixth embodiment of the present disclosure.

In certain embodiments, it is feasible to replace the resistor R1, the resistor R3, the resistor R5 and the resistor R7 of the amplifier 300 with the capacitors C1-C4, as shown in the amplifier 700 of FIG. 7. Since the capacitors C1-C4 are open to the DC, it is better to use a current source to control the DC voltage. In other words, the amplifier 700 of FIG. 7 requires the current source 302 and the current source 304 at the gate of the positive-end N-type transistor NMp and the gate of the negative-end N-type transistor NMn, respectively. It should be noted that the current source 302 and current source 304 can be instead set at the gate of the positive-end P-type transistor PMp and the gate of the negative-end P-type transistor PMn, or current sources can be set at all of the gate of the positive-end N-type transistor NMp, the gate of the negative-end N-type transistor NMn, the gate of the positive-end P-type transistor PMp and the gate of the negative-end P-type transistor PMn.

Figure 8:
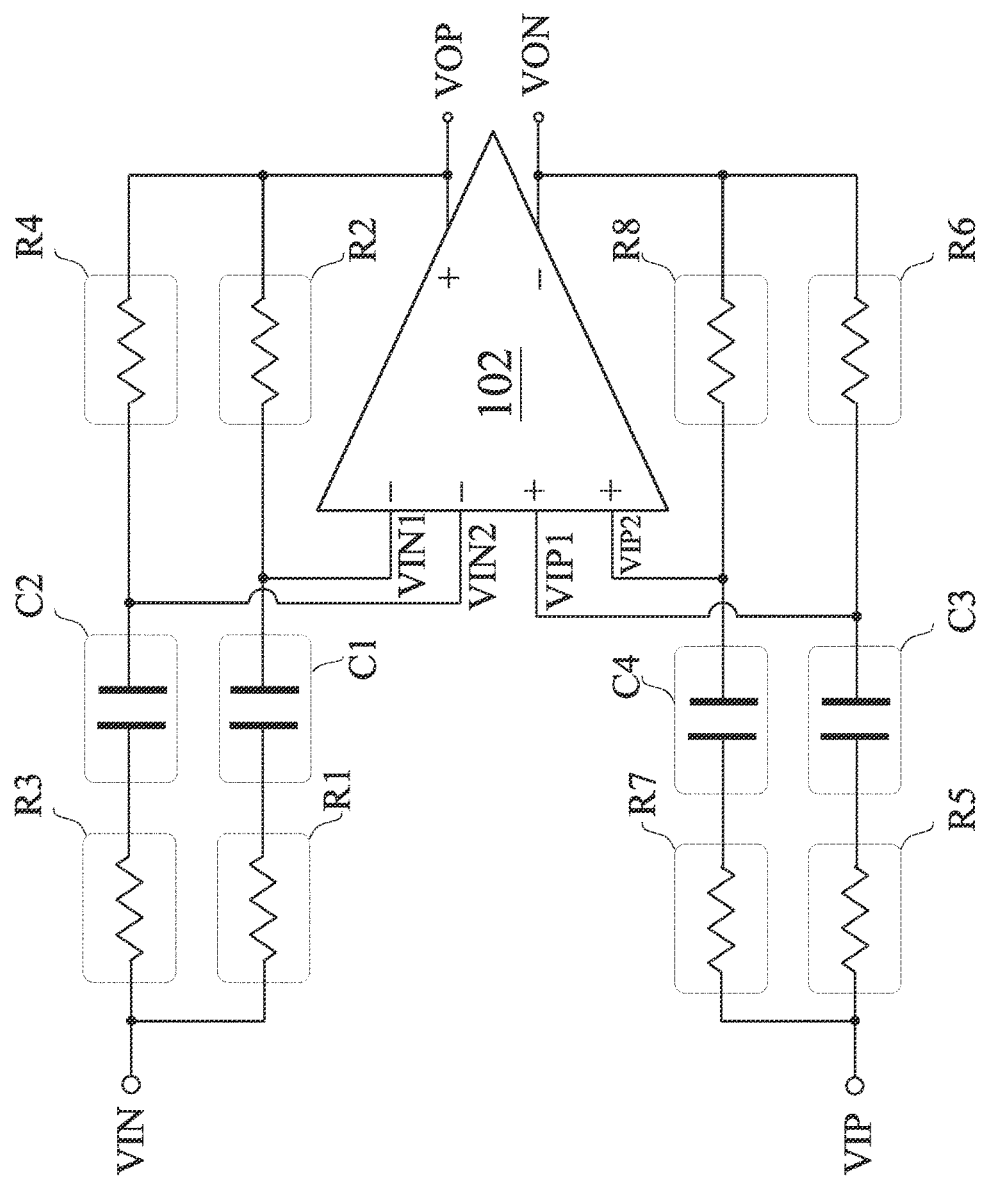
FIG. 8 is a schematic diagram illustrating an amplifier according to a seventh embodiment of the present disclosure.
Figure 9:
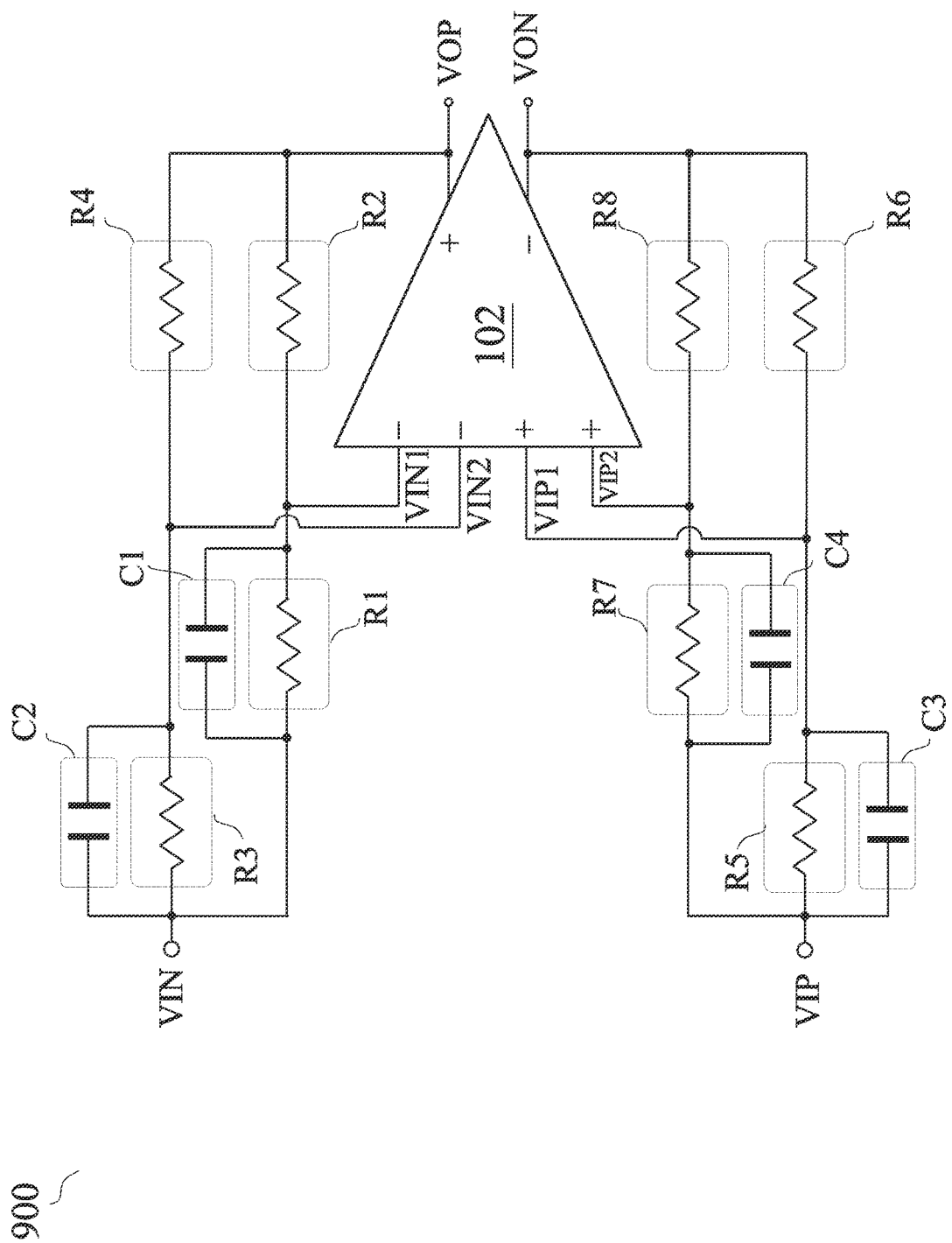
FIG. 9 is a schematic diagram illustrating an amplifier according to an eighth embodiment of the present disclosure.

In certain embodiments, it is feasible to combine the amplifier 300 and the amplifier 700, and have the resistor R1, the resistor R3, the resistor R5 and the resistor R7 set in series with the capacitors C1-C4, correspondingly, as shown in the amplifier 800 of FIG. 8. In certain embodiments, it is feasible to have the resistor R1, the resistor R3, the resistor R5 and the resistor R7 set in parallel with the capacitors C1-C4, as shown in the amplifier 900 of FIG. 9.

The present disclosure is not limited to the differential architecture; in certain embodiments, the amplifier 100/300/400/500/600/700/800/900 can be adapted to single-end amplifier architecture.

What is claimed is:
1. An amplifier, comprising:
an amplifying unit, comprising:
a positive-end P-type transistor;
a negative-end P-type transistor;
a positive-end N-type transistor, wherein the positive-end P-type transistor and the positive-end N-type transistor are connected in series between a first reference voltage and a second reference voltage, and a drain of the positive-end N-type transistor is coupled to a drain of the positive-end P-type transistor and outputs a negative-end output signal; and
a negative-end N-type transistor, wherein the negative-end P-type transistor and the negative-end N-type transistor are connected in series between the first reference voltage and the second reference voltage, a drain of the negative-end N-type transistor is coupled to a drain of the negative-end P-type transistor and outputs a positive-end output signal;
a first resistor, coupled between a gate of the negative-end N-type transistor and a negative-end input signal;
a second resistor, coupled between the gate of the negative-end N-type transistor and the positive-end output signal;
a third resistor, coupled between a gate of the negative-end P-type transistor and the negative-end input signal; and
a fourth resistor, coupled between the gate of the negative-end P-type transistor and the positive-end output signal.

2. The amplifier of claim 1, wherein a ratio of the resistance of the first resistor to the resistance of the second resistor differs from a ratio of the resistance of the third resistor to the resistance of the fourth resistor.

3. The amplifier of claim 1, wherein a ratio of the resistance of the first resistor to the resistance of the second resistor equals to a ratio of the resistance of the third resistor to the resistance of the fourth resistor, and the amplifier further comprises a current source coupled to a gate of the negative-end N-type transistor or a gate of the negative-end P-type transistor, to control DC voltage of a gate of the negative-end N-type transistor or the DC voltage of a gate of the negative-end P-type transistor.

4. The amplifier of claim 1, wherein the DC voltage of a gate of the negative-end N-type transistor differs from the DC voltage of a gate of the negative-end P-type transistor.

5. The amplifier of claim 1, further comprising:
a fifth resistor, coupled between a gate of the positive-end N-type transistor and a positive-end input signal;
a sixth resistor, coupled between the gate of the positive-end N-type transistor and the negative-end output signal;
a seventh resistor, coupled between a gate of the positive-end P-type transistor and the positive-end input signal; and
an eighth resistor, coupled between the gate of the positive-end P-type transistor and the negative-end output signal.

6. The amplifier of claim 5, wherein a ratio of the resistance of the fifth resistor to the resistance of the sixth resistor differs from a ratio of the resistance of the seventh resistor to the resistance of the eighth resistor.

7. The amplifier of claim 5, wherein a ratio of the resistance of the fifth resistor to the resistance of the sixth resistor equals to a ratio of the resistance of the seventh resistor to the resistance of the eighth resistor, and the amplifier further comprises a current source coupled to the gate of the positive-end N-type transistor or the gate of the positive-end P-type transistor to control DC voltage of the gate of the positive-end N-type transistor or DC voltage of the gate of the positive-end P-type transistor.

8. The amplifier of claim 5, wherein DC voltage of the gate of the positive-end N-type transistor differs from DC voltage of the gate of the positive-end P-type transistor.

9. The amplifier of claim 5, further comprising:
a first capacitor, coupled between the gate of the negative-end N-type transistor and the positive-end output signal;
a second capacitor, coupled between the gate of the negative-end P-type transistor and the positive-end output signal;
a third capacitor, coupled between the gate of the positive-end N-type transistor and the negative-end output signal; and
a fourth capacitor, coupled between the gate of the positive-end P-type transistor and the negative-end output signal.

10. The amplifier of claim 9, wherein the first capacitor and the second resistor are connected in series, the second capacitor and the fourth resistor are connected in series, the third capacitor and the sixth resistor are connected in series, and the fourth capacitor and the eighth resistor are connected in series.

11. The amplifier of claim 9, wherein the first capacitor and the second resistor connected in parallel, the second capacitor and the fourth resistor connected in parallel, the third capacitor and the sixth resistor connected in parallel, and the fourth capacitor and the eighth resistor connected in parallel.

12. The amplifier of claim 5, further comprising:
a first capacitor, coupled between the gate of the negative-end N-type transistor and the negative-end input signal;
a second capacitor, coupled between the gate of the negative-end P-type transistor and the negative-end input signal;
a third capacitor, coupled between the gate of the positive-end N-type transistor and the positive-end input signal; and
a fourth capacitor, coupled between the gate of the positive-end P-type transistor and the positive-end input signal.

13. The amplifier of claim 12, wherein the first capacitor and the first resistor are connected in series, the second capacitor and the third resistor are connected in series, the third capacitor and the fifth resistor are connected in series, and the fourth capacitor and the seventh resistor are connected in series.

14. The amplifier of claim 12, wherein the first capacitor and the first resistor connected in parallel, the second capacitor and the third resistor connected in parallel, the third capacitor and the fifth resistor connected in parallel, and the fourth capacitor and the seventh resistor connected in parallel.

15. An amplifier, comprising:
an amplifying unit, comprising:
a positive-end P-type transistor;
a negative-end P-type transistor;
a positive-end N-type transistor, wherein the positive-end P-type transistor and the positive-end N-type transistor are connected in series between a first reference voltage and a second reference voltage, and a drain of the positive-end N-type transistor is coupled to a drain of the positive-end P-type transistor and outputs a negative-end output signal; and
a negative-end N-type transistor, wherein the negative-end P-type transistor and the negative-end N-type transistor are connected in series between the first reference voltage and the second reference voltage, and a drain of the negative-end N-type transistor is coupled to a drain of the negative-end P-type transistor and outputs a positive-end output signal;
a first resistor, coupled between a gate of the negative-end N-type transistor and a negative-end input signal;
a second resistor, coupled between a gate of the negative-end P-type transistor and the negative-end input signal;
a first capacitor, coupled between the gate of the negative-end N-type transistor and the positive-end output signal;
a second capacitor, coupled between the gate of the negative-end P-type transistor and the positive-end output signal; and
a first current source, coupled to the gate of the negative-end N-type transistor or the gate of the negative-end P-type transistor, to control DC voltage of the gate of the negative-end N-type transistor or DC voltage of the gate of the negative-end P-type transistor.

16. The amplifier of claim 15, wherein the DC voltage of the gate of the negative-end N-type transistor differs from the DC voltage of the gate of the negative-end P-type transistor.

17. The amplifier of claim 15, further comprising:
a third resistor, coupled between the gate of the positive-end N-type transistor and a positive-end input signal;
a fourth resistor, coupled between the gate of the positive-end P-type transistor and the positive-end input signal;
a third capacitor, coupled between the gate of the positive-end N-type transistor and the negative-end output signal;
a fourth capacitor, coupled between the gate of the positive-end P-type transistor and the negative-end output signal; and
a second current source, coupled to the gate of the positive-end N-type transistor or the gate of the positive-end P-type transistor, to control the DC voltage of the gate of the positive-end N-type transistor or the DC voltage of the gate of the positive-end P-type transistor.

18. An amplifier, comprising:
an amplifying unit, comprising:
a positive-end P-type transistor;
a negative-end P-type transistor;
a positive-end N-type transistor, wherein the positive-end P-type transistor and the positive-end N-type transistor are connected in series between a first reference voltage and a second reference voltage, and a drain of the positive-end N-type transistor is coupled to a drain of the positive-end P-type transistor and outputs a negative-end output signal; and
a negative-end N-type transistor, wherein the negative-end P-type transistor and the negative-end N-type transistor are connected in series between the first reference voltage and the second reference voltage, and a drain of the negative-end N-type transistor is coupled to a drain of the negative-end P-type transistor and outputs a positive-end output signal;
a first capacitor, coupled between a gate of the negative-end N-type transistor and a negative-end input signal;
a second capacitor, coupled between a gate of the negative-end P-type transistor and the negative-end input signal;
a first resistor, coupled between the gate of the negative-end N-type transistor and the positive-end output signal;
a second resistor, coupled between the gate of the negative-end P-type transistor and the positive-end output signal; and
a first current source, coupled to the gate of the negative-end N-type transistor or the gate of the negative-end P-type transistor, to control DC voltage of the gate of the negative-end N-type transistor or DC voltage of the gate of the negative-end P-type transistor.

19. The amplifier of claim 18, wherein the DC voltage of the gate of the negative-end N-type transistor differs from the DC voltage of the gate of the negative-end P-type transistor.

20. The amplifier of claim 18, further comprising:
a third capacitor, coupled between the gate of the positive-end N-type transistor and a positive-end input signal;
a fourth capacitor, coupled between the gate of the positive-end P-type transistor and the positive-end input signal;
a third resistor, coupled between the gate of the positive-end N-type transistor and the negative-end output signal;

a fourth resistor, coupled between the gate of the positive-end P-type transistor and the negative-end output signal; and a second current source, coupled to the gate of the positive-end N-type transistor or the gate of the positive-end P-type transistor, to control the DC voltage of the gate of the positive-end N-type transistor or the DC voltage of a gate of the positive-end P-type transistor.

* * * * *